United States Patent [19]

Watanabe et al.

[11] Patent Number: 4,462,021
[45] Date of Patent: Jul. 24, 1984

[54] DIGITAL-TO-ANALOG CONVERTER THAT COMPENSATES FOR INTEGRATED CIRCUIT RESISTOR VARIATIONS

[75] Inventors: Kazuo Watanabe, Hadano; Masaru Sugita, Minami-ashigara, both of Japan

[73] Assignee: Sony Corporation, Tokyo, Japan

[21] Appl. No.: 347,551

[22] Filed: Feb. 10, 1982

[30] Foreign Application Priority Data

Feb. 13, 1981 [JP] Japan ................................. 56-19800

[51] Int. Cl.³ ........................................... H03K 13/02
[52] U.S. Cl. ..................... 340/347 DA; 340/347 CC; 340/347 M
[58] Field of Search ..... 340/347 M, 347 DA, 347 CC

[56] References Cited

U.S. PATENT DOCUMENTS

| | | | |
|---|---|---|---|
| 3,689,754 | 9/1972 | Le Febre | 364/608 |
| 3,997,892 | 12/1976 | Susset | 340/347 M X |
| 4,146,882 | 3/1979 | Hoff, Jr. et al. | 340/347 DA |
| 4,293,848 | 10/1981 | Cheng et al. | 340/347 M X |

OTHER PUBLICATIONS

Landee et al., Electronic Designers' Handbook, McGraw-Hill Book Co., Inc., 1957, pp. 23-31.

Primary Examiner—T. J. Sloyan
Attorney, Agent, or Firm—Lewis H. Eslinger; Alvin Sinderbrand

[57] ABSTRACT

A D/A converter is comprised of a string of resistors coupled to a voltage source with respective junctions formed between adjacent resistors, including a reference junction substantially at the mid-point of the resistor string. Plural switches are coupled to the junctions and are selectively operable to couple a potential produced at a respective junction. A subtracting circuit has one input coupled in common to a first set of the switches and another input coupled in common to a second set of the switches to subtract the potential coupled from one set from the potential coupled from the other set so as to produce an output analog signal. A switch control circuit is responsive to a multi-bit digital signal for operating predetermined switches in both the first and second sets and thereby couple to the subtracting circuit the potentials which are produced at corresponding junctions on either side of the reference junction.

16 Claims, 6 Drawing Figures

DIGITAL-TO-ANALOG CONVERTER THAT COMPENSATES FOR INTEGRATED CIRCUIT RESISTOR VARIATIONS

BACKGROUND OF THE INVENTION

This invention relates to a digital-to-analog converter and, more particularly, to such a converter which is readily adapted to be constructed as an integrated circuit and may be formed of relatively low-cost resistive elements having a high range of tolerance without deleteriously affecting the resultant analog signal produced thereby.

A conventional digital-to-analog (D/A) converter typically is formed of a plurality of series-connected resistors coupled to a source of voltage potential so as to form a voltage divider network; and a particular tap of the voltage divider network is selected as a function of the digital signal which is to be converted to analog form. For example, a 3-bit digital signal may be converted to any one of eight possible analog levels. To convert such a 3-bit digital signal, eight series-connected resistors are coupled between a voltage source and, for example, ground. An analog output terminal is selectively connected by way of a so-called "switching tree" network to one of the seven taps which are formed by the 8-resistor string. Depending upon which tap is connected to the output terminal, the resultant analog output signal level will be equal to $\frac{1}{8}$ V, 2/8 V, $\frac{3}{8}$ V, ... 6/8 V or $\frac{7}{8}$ V, wherein V is the magnitude of the voltage source. In one type of switching tree network, the most significant bit of the 3-bit digital signal is used to select one or another path from the output terminal to the resistor string, depending upon whether the most significant bit is a binary "1" or "0". Similarly, in each path, the next most significant bit establishes one or another sub-path depending upon whether this next significant bit is a binary "1" or "0". Finally, each sub-path is connected to the resistor string through one or another switch depending upon whether the least significant bit is a binary "1" or "0".

When the aforementioned D/A converter is constructed as an integrated circuit, both the resistors and the switching tree are formed on the same chip or IC pellet. To consolidate space, the string of resistors may be disposed as comb-shaped resistors in a serpentine or zig-zag pattern. As one example, the resistors may be etched of photo-resist material. However, even with present-day integrated circuit technology, there is a strong likelihood that the resistance values of the resistors are not precisely equal. Typically, small errors are present in such resistance values, and these errors are cumulative from one end of the resistor string to the other. That is, if the ideal resistance value is R, the actual resistance value of the last resistor in the string may differ from R by a greater amount, or error, than the resistor at the beginning of the string.

In view of the foregoing, integrated circuit D/A converters generally are designed with resistors having resistance values that fall within a tolerable range of error. The maximum tolerable error is limited to that error which results in a change in the analog output level equal to one-half the voltage difference when the least significant bit of the digital signal changes over from one logic state to another. In a 3-bit D/A converter, the maximum tolerable error thus is equal to that change in resistance which results in an output analog voltage level change equal to 1/16 V.

In a 3-bit D/A converter having a string of eight resistors each of which having a resistance value that is within the tolerable error range discussed above, the overall resistance error of the eight resistors may be assumed to be equal to zero, with the first two resistors each having a resistance R−2Δr, the next two resistors each having a resistance R−Δr, the next two resistors each having a resistance R+Δr, and the last two resistors each having a resistance R+2Δr. This is consistent with the aforementioned integrated circuit fabrication wherein the resistance error generally may be viewed as increasing from the first to the last resistor in the string. Now, with such a D/A converter, if the digital signal to be converted is, for example, [100], the typical switching tree network connects the D/A converter output terminal to a generally center tap of the resistor string. The resultant voltage divider which is established thereby is constituted by the last four resistors of the string, thereby producing the output analog voltage level $V_{out}$ which is represented as:

$$V_{out} = \frac{(R - 2\Delta r)+(R - 2\Delta r)+(R - \Delta r)+(R - \Delta r)}{8R} \text{ V}$$

$$V_{out} = \frac{4R - 6\Delta r}{8R} \text{ V}$$

As mentioned above, the maximum tolerable error is limited to ±1/16 V. Thus, the error due to the resistance error 6Δr/8R must be limited to 1/16, whereby the maximum tolerable resistance error Δr/R must be limited to ±8.3% for a 3-bit D/A converter. Using this analysis to calculate the maximum tolerable resistance error in an 8-bit D/A converter results in constructing resistors within a tolerance of ±0.4%. It is exceedingly difficult, and quite expensive, to manufacture integrated circuits having resistance values within ±0.4% limits.

OBJECTS OF THE INVENTION

Therefore, it is an object of the present invention to provide a digital-to-analog converter which may be formed as an integrated circuit and which overcomes the aforenoted disadvantages.

Another object of this invention is to provide a D/A converter including series-connected resistors whose resistance values need not be manufactured within the aforenoted constrained tolerances.

A further object of this invention is to provide a D/A converter which is of relatively simple construction, is relatively inexpensive to manufacture, and does not require highly precise resistors.

An additional object of this invention is to provide a D/A converter formed of a string of series-connected resistors whose resistance values may differ from a desired value, this difference progressively increasing from the first to the last resistor in the string, but such resistance errors having substantially no error effect upon the analog signal which is produced therefrom.

Yet another object of this invention is to provide an improved D/A converter of the aforenoted type, which converter can be used to convert a digital signal to an analog output level, and which converter alternatively can be used in conjunction with other apparatus as an analog-to-digital converter.

Various other objects, advantages and features of the present invention will become readily apparent from the ensuing detailed description, and the novel features will be particularly pointed out in the appended claims.

SUMMARY OF THE INVENTION

In accordance with this invention, a digital-to-analog converter is comprised of a string of series-connected resistors having junctions formed between adjacent ones of such resistors, including a reference junction disposed substantially at the mid-point of the resistor string. The resistors are connected to a voltage source so as to form a voltage divider network having a plurality of taps. A switching tree is coupled to these taps and is selectively operable to couple a voltage-divided potential which is produced at a respective tap. A subtracting circuit has one input coupled to a first set of the switches to receive a respective voltage-divided potential when a switch included in that first set is operated, and the subtracting circuit has another input coupled to a second set of the switches to receive another voltage-divided potential when a switch included in that second set is operated. The subtracting circuit functions to subtract one of the voltage-divided potentials from the other to produce an analog output signal. A switch control circuit is responsive to a multi-bit digital signal for operating a predetermined switch in each of the first and second sets of switches, such that voltage-divided potentials which are produced at corresponding taps disposed on either side of the reference junction are coupled to the subtracting circuit in accordance with the value of the digital signal.

In one embodiment, the respective taps which are selected by the sets of switching circuits are separated from the reference junction by equal numbers of resistors when the digital signal exhibits an even numerical value; and when the digital signal exhibits an odd numerical value, the tap selected by one set is separated from the reference junction by one more resistor than the tap which is selected by the other set.

In preferred applications, the digital-to-analog converter of the present invention may be used to convert a digital signal into a corresponding analog level; and the converter also may be used in conjunction with other circuitry to form an analog-to-digital converter.

BRIEF DESCRIPTION OF THE DRAWINGS

The following detailed description, given by way of example, will best be understood in conjunction with the accompanying drawings in which.

DETAILED DESCRIPTION OF PREFERRED EMBODIMENTS

Referring now to the drawings, wherein like reference numerals are used throughout, the present invention will best be understood by first referring to a digital-to-analog converter of the type which optimally includes highly precise resistors. One embodiment of such a digital-to-analog converter is illustrated schematically in FIG. 1. In this D/A converter, a string of series-connected resistors 11, 12, ... 17 and 18 is connected in series between a voltage source 1 and a reference potential, such as ground. Adjacent resistors define junctions, or taps, therebetween; and each tap is coupled to a D/A converter output terminal 2 via respective switches included in a switching tree network. In particular, output terminal 2 is coupled via two alternative paths established by switches $S_{20}$ and $S_{21}$, respectively. Switch $S_{20}$ is coupled to two alternative sub-paths which include switches $S_{10}$ and $S_{11}$, respectively. Likewise, switch $S_{21}$ is coupled to two alternative sub-paths which include switches $S_{12}$ and $S_{13}$, respectively. Switch $S_{10}$ is coupled by a switch $S_{01}$ to the tap formed between resistors 11 and 12. Switch $S_{11}$ is coupled by a switch $S_{02}$ to the tap formed between resistors 12 and 13, and also is coupled by a switch $S_{03}$ to the tap formed between resistors 13 and 14. Switch $S_{12}$ is coupled by a switch $S_{04}$ to the tap formed between resistors 14 and 15; and also is coupled by a switch $S_{05}$ to the tap formed between resistors 15 and 16. Finally, switch $S_{13}$ is coupled by a switch $S_{06}$ to the tap formed between resistors 16 and 17; and is coupled by a switch $S_{07}$ to the tap formed between resistors 17 and 18.

Figure 1:
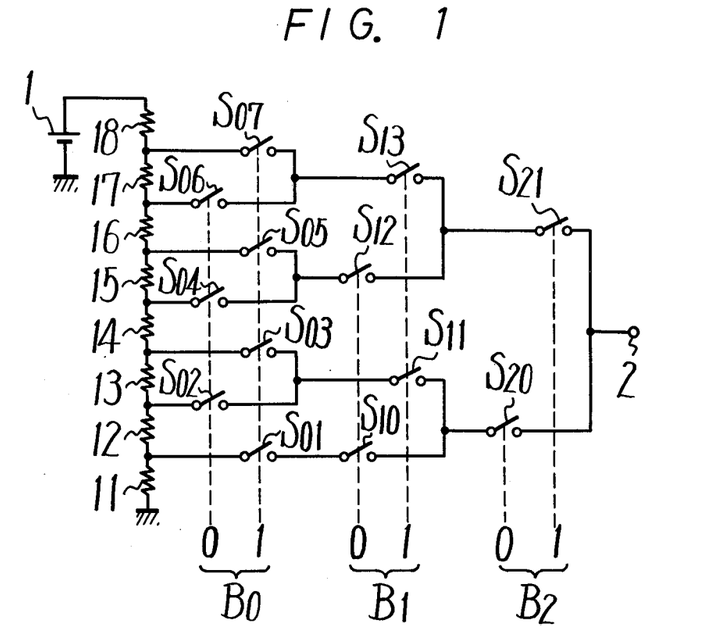
FIG. 1 is a schematic diagram of a typical digital-to-analog converter which must be formed of highly precise resistors.

The D/A converter illustrated in FIG. 1 is adapted to convert a 3-bit digital signal to a corresponding analog level. Switches $S_{01}$ ... $S_{07}$ are selectively operated as a function of the logic state of least significant bit $B_0$. In particular, if the least significant bit $B_0$ is a binary "0", then each of switches $S_{02}$, $S_{04}$ and $S_{06}$ is operated, or closed. Alternatively, if the least significant bit $B_0$ is a binary "1", then each of switches $S_{01}$, $S_{03}$, $S_{05}$ and $S_{07}$ is operated, or closed.

Switches $S_{10}$ ... $S_{13}$ are selectively operated as a function of the logic state of next significant bit $B_1$. If this next significant bit $B_1$ is a binary "0", then switches $S_{10}$ and $S_{12}$ both are operated, or closed. Alternatively, if the next significant bit $B_1$ is a binary "1", then switches $S_{11}$ and $S_{13}$ both are operated, or closed.

Finally, switches $S_{20}$ and $S_{21}$ are selectively operated as a function of the logic state of the most significant bit $B_2$. If this most significant bit is a binary "0", then switch $S_{20}$ is operated, or closed. Conversely, if the most significant bit is a binary "1", then switch $S_{21}$ is operated, or closed.

Although not illustrated in FIG. 1, it should be appreciated that an additional switch may be coupled from ground potential to the point defined by switches $S_{01}$ and $S_{10}$ such that, when the 3-bit digital signal is [000] output terminal 2 is supplied with an analog voltage approximately equal to 0 volts.

If it is assumed that the resistance of each of resistors 11 ... 18 is equal to R, then, depending upon the numerical value of the 3-bit digital signal $[B_2 B_1 B_0]$, a respective tap, or junction, of the string of series-connected resistors is coupled by the illustrated switching tree network to output terminal 2 so as to establish a corresponding resistive voltage-divider. Thus, if the digital signal is represented as [001], the tap between resistors 11 and 12 is coupled to output terminal 2, resulting in a voltage divider ratio R/8R, so as to produce the output analog voltage $V_{out} = \frac{1}{8}$ V, where V is the voltage produced by voltage source 1. If the digital signal is [010], then the tap between resistors 12 and 13 is coupled to output terminal 2, resulting in a voltage divider ratio of (2R/8R), and the output analog voltage produced at output terminal 2 is equal to $\frac{1}{4}$ V. Similar voltage dividers are established by other digital signals.

Let it be assumed that the digital signal is represented as [100]. It is appreciated that this digital signal results in the operation, or closing, of switches $S_{21}$, $S_{12}$ and $S_{04}$, respectively. Hence, the tap formed between resistors 14 and 15 is coupled to output terminal 2. The resultant analog voltage level which is produced at the output terminal is seen to be $V_{out} = (4R/8R)V = V/2$. As mentioned above, when the illustrated D/A converter is constructed as an integrated circuit, the resistance values of each resistors 11 . . . 18 generally varies from the ideal resistance value R. Typically, the resistance error, that is, the deviation of the actual resistance value from its desired resistance value R, increases progressively and, generally, linearly, from the first resistor included in the resistive string to the last. Hence, the resistance value of, for example, resistor 18 may be thought of as being equal to the least (or greatest) resistance, and the resistance value of resistor 11 may be thought of as being the greatest (least) resistance.

Figure 2:
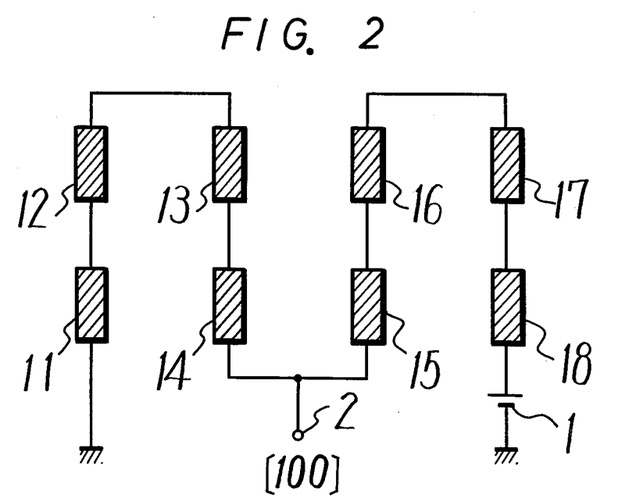
FIG. 2 is a schematic diagram representing the arrangement, or pattern, of the resistors used in the embodiment shown in FIG. 1.

One arrangement of resistors 11 . . . 18 may be the comb-shaped serpentine, or zig-zag pattern, illustrated in FIG. 2. The arrangement shown in FIG. 2 is, additionally, assumed to be coupled by the switching tree network to output terminal 2 in response to the digital signal [100]. Thus, and as clearly shown in FIG. 2, it is assumed that the tap formed between resistors 14 and 15 is coupled, as by switches $S_{04}$, $S_{12}$ and $S_{21}$, to output terminal 2. Let it be assumed that the resistance errors in the string of resistors 11 . . . 18 progressively changes such that, for example, resistor 11 exhibits the largest resistance and resistor 18 exhibits the least resistance. It also is reasonable to assume that the resistance errors of resistors 11 and 12 are equal, and such resistance errors may be represented as $+2\Delta r$. The resistance errors of resistors 13 and 14 also are equal to each other and are assumed to be less than the resistance errors of resistors 11 and 12. The resistance error of each of resistors 13 and 14 may be represented as $+\Delta r$. In similar fashion, the resistance error of each of resistors 16 and 17 may be represented as $-\Delta r$; and the resistance error of each of resistors 17 and 18 may be represented as $-2\Delta r$.

With the foregoing assumption, the actual output voltage produced at output terminal 2 in response to the digital signal [100] is seen to be equal to:

$$V_{out} = \frac{(R - 2\Delta r) + (R - 2\Delta r) + (R - \Delta r) + (R - \Delta r)}{8R} V$$

$$V_{out} = \frac{4R - 6\Delta r}{8R} V$$

The maximum tolerable resistance error must be limited to one-half of the voltage difference that is produced at output terminal 2 when the least significant bit $B_0$ changes over from one logic state to another. It is appreciated that, in the illustrated 3-bit D/A converter when the least significant bit $B_0$ changes over, the analog output voltage produced at output terminal 2 is increased or decreased by an amount equal to $\frac{1}{8}$ V. Hence, the maximum tolerable resistance error is limited to that amount which results in an output voltage change equal to 1/16 V.

Now, since the maximum permissible error due to resistance deviations is equal to $\pm 1/16$ V, the tolerable resistance error $\Delta r/R$ may be determined from the foregoing equation wherein:

$$V_{out} = \frac{4R - 6\Delta r}{8R} V = \frac{1}{2} V \pm \frac{1}{16} V$$

from which $(\Delta r/R) = \pm 8.3\%$. This range of tolerable resistance error is determined for a 3-bit D/A converter of the type illustrated in FIGS. 1 and 2. If the illustrated converter is expanded so as to operate as an 8-bit D/A converter, then the resistance tolerance $\Delta r/R$ would be substantially reduced to within $\pm 0.4\%$. As mentioned above, it is relatively difficult and expensive to manufacture integrated circuitry having precise resistors within the tolerance of $\pm 0.4\%$.

The present invention, now described, overcomes the aforenoted disadvantages attending the D/A converter shown in FIG. 1. In particular, and as will become apparent, the D/A converter of the present invention may be constructed of resistors having a wide range of tolerance, without having resistance errors deleteriously affect the accuracy of the output analog signal produced therefrom.

Figure 3:
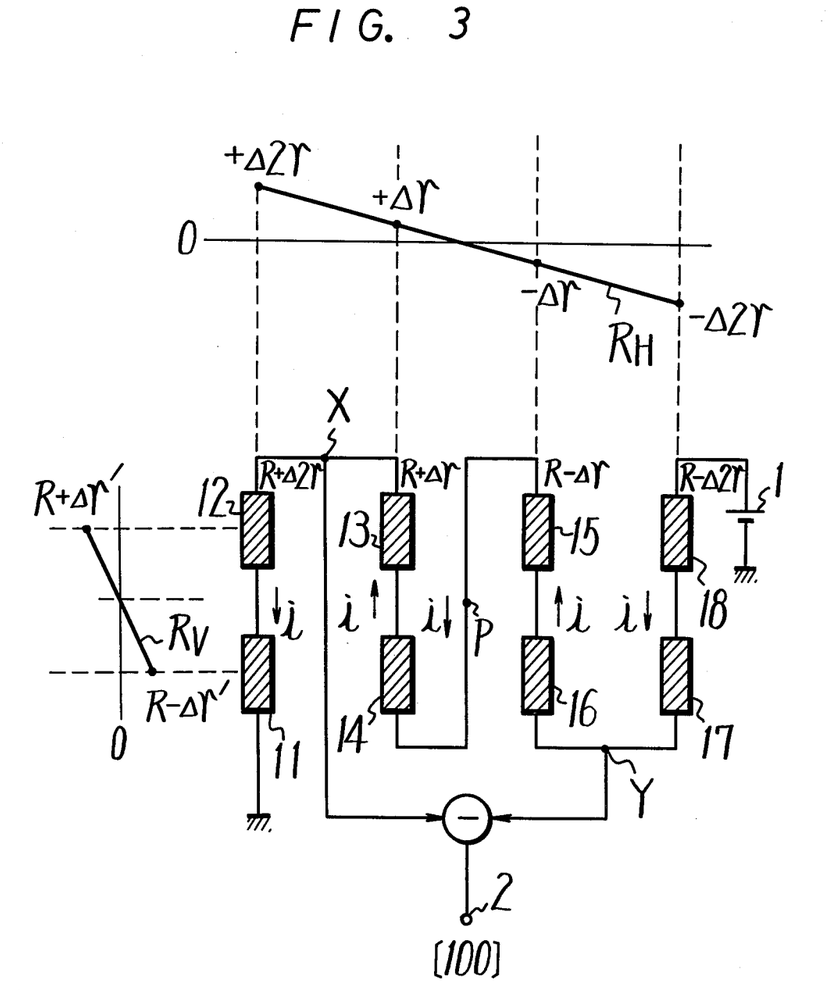
FIG. 3 is a schematic representation of the arrangement of the resistors which are used with the present invention, including a graphical representation of the relationship of such resistors.

Referring now to FIG. 3, the resistors 11 . . . 18 shown previously with respect to FIG. 2 also are illustrated as being arranged in comb-shaped configuration having a serpentine, or zig-zag, pattern. The graphical representation above the illustrated resistors is intended to represent that the resistance errors gradually and regularly decrease from the resistance errors of resistors 11 and 12 to the resistance errors of resistors 17 and 18. Alternatively, such resistance errors may gradually and regularly increase. Furthermore, and from the graphical representation shown to the left of the illustrated resistors, it may be assumed that the resistance errors of each pair of resistors also changes. Thus, the resistance errors of resistors 11 and 12 each is assumed to be equal to $+2\Delta r$, and the relative resistance error of resistor 11 is assumed to be $-\Delta r'$ while the relative resistance error of resistor 12 is assumed to be $+\Delta r'$. Likewise, the resistance error of each of resistors 13 and 14 is assumed to be equal to $+\Delta r$, and the relative resistance error of resistor 13 is assumed to be $+\Delta r'$ while the relative resistance error of resistor 14 is assumed to be $-\Delta r'$. Point P is assumed to be a reference junction, to be described, and is disposed substantially at the mid-point of the string of resistors 11 . . . 18. The relative resistance error at reference junction P is assumed to be zero.

Resistors 15, 16, 17 and 18 are seen to be symmetrical with resistors 11, 12, 13 and 14, relative to reference junction P. Hence, the resistance error of each of resistors 15 and 16 is equal to $-\Delta r$, with the relative resistance error of resistor 15 being equal $+\Delta r'$ and the relative resistance error of resistor 16 being equal to $-\Delta r'$. Likewise, the resistance error of each of resistors 17 and 18 is on the order of $-2\Delta r$, with the relative resistance error of resistor 18 equal to $+\Delta r'$ and the relative resistance error of resistor 17 being equal to $-\Delta r'$. Thus, the upper graphical representation shown in FIG. 3 represents the regular decreasing (or increasing) resistance error moving in the left-to-right direction of the string of series-connected resistors; and the graphical representation shown at the lefthand portion of FIG. 3 represents the relative resistance error moving in the top-to-bottom direction.

It is seen that, in the series-connected string of resistors, the current flowing through each pair of resistors disposed on one side of reference junction P is in the same direction as the current flowing through the symmetrical pairs of resistors disposed on the other side of reference junction P. Thus, current flows in the downward direction through resistors 11 and 12 and also through resistors 17 and 18; and current flows in the upward direction through resistors 13 and 14 and also through resistors 15 and 16.

In one embodiment of the present invention, resistors 11-14, which are disposed on one side of reference junction P, are selectively connected by one set of switches to one input of a subtracting circuit; and resistors 15-18, which are disposed on the other side of reference junction P, also are selectively connected to another input of the subtracting circuit by way of a second set of switches. The schematic representation illustrated in FIG. 3 depicts the operation of those switches in response to the input digital signal [100]. It is seen that, with this digital signal, the resistance divider formed of resistors 11 and 12 is connected, at a tap designated X, to one input of the subtracting circuit, and the resistance divider comprised of resistors 11 ... 16 is connected, at the tap designated Y, to the other input of the subtracting circuit. The difference between the voltages at taps Y and X is obtained by the subtracting circuit and provided as the analog output voltage at output terminal 2.

Figure 4:
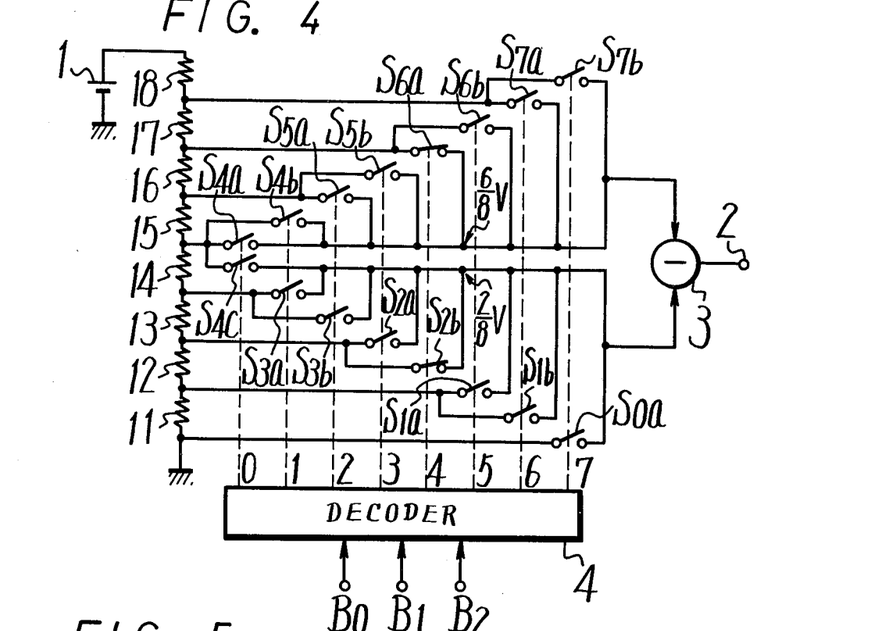
FIG. 4 is a schematic diagram of one embodiment of the present invention.

Referring particularly now to the embodiment illustrated in FIG. 4, the taps, or junctions, defined by adjacent ones of the string of resistors 11 ... 18 are connected, via respective switches included in first and second sets of switching circuits, to the aforementioned input terminals of a subtracting circuit 3. In particular, switches $S_{0a}$, $S_{1a}$, $S_{1b}$, $S_{2a}$, $S_{2b}$, $S_{3a}$, $S_{3b}$ and $S_{4c}$ may be considered as comprising a first set of switches. Similarly, switches $S_{4a}$, $S_{4b}$, $S_{5a}$, $S_{5b}$, $S_{6a}$, $S_{6b}$, $S_{7a}$ and $S_{7b}$ may be considered as comprising the second set of switches. As illustrated, the first set of switches includes a common output which is coupled to one input of subtracting circuit 3; and the second set of switches also is provided with a common output that is coupled to the second input of the subtracting circuit. Switch $S_{0a}$ is operable to couple ground potential to the output of the first set of switches. Switches $S_{1a}$ and $S_{1b}$ are connected in parallel and are separately operable to couple the divided voltage at the tap defined by resistors 11 and 12 to the output of the first set of switches. Likewise, switches $S_{2a}$ and $S_{2b}$ are connected in parallel and are separately operable to couple the divided voltage potential produced at the tap defined by resistors 12 and 13 to the output of the first set of switches. Switches $S_{3a}$ and $S_{3b}$ also are connected in parallel and are separately operable to couple the voltage potential produced at the tap defined by adjacent resistors 13 and 14 to the output of the first set of switches. Finally, switch $S_{4c}$ is coupled to the tap defined by resistors 14 and 15 and is operable to couple the voltage potential produced at that tap to the output of the first set of switches.

The tap formed between resistors 14 and 15 is referred to herein as the reference junction and, as illustrated, is substantially disposed at the mid-point of the series-connected string of resistors 11 ... 18. Thus, in the illustrated embodiment, four resistors 11, 12, 13 and 14 are connected in series to one side of this reference junction, and four resistors 15, 16, 17 and 18 are connected in series to the other side of this reference junction. Of course, voltage source 1 is connected to supply a current in series through these resistors. The reference junction, in addition to being coupled to the output of the first set of switches by switch $S_{4c}$, also is coupled to the output of the second set of switches by parallel-connected, separately operable switches $S_{4a}$ and $S_{4b}$. The tap defined by adjacent resistors 15 and 16 is coupled to the output of the second set of switches by parallel-connected, separately operable switches $S_{5a}$ and $S_{5b}$. Likewise, the tap formed between adjacent resistors 16 and 17 is coupled to the output of the second set of switches by parallel-connected, separately operable switches $S_{6a}$ and $S_{6b}$. Finally, the tap formed between adjacent resistors 17 and 18 is coupled to the output of the second set of switches by parallel-connected, separately operable switches $S_{7a}$ and $S_{7b}$.

It is seen that, in the embodiment shown in FIG. 4, each tap is coupled to the output of a respective set of switches by a pair of parallel-connected, separately operable switching circuits. The reference junction is connected to the output of both sets of switches.

The embodiment of FIG. 4 also includes a decoder 4 which is connected to receive the input digital signal [$B_2 B_1 B_0$]. The decoder, which may be a conventional digital decoder, includes outputs 0-7, each output being provided with a respective control signal as a function of the numerical value of the digital signal [$B_2 B_1 B_0$]. For example, if the digital signal is represented as [000], the 0 output is provided with a control signal. Likewise, if the digital signal is represented as [001], the 1 output of decoder 4 is provided with a control signal. Thus, it is appreciated that if the digital signal is represented as [100], which has a numerical value of "4", the 4 output of decoder 4 is provided with the control signal. Finally, if the digital signal is represented as [111], which has a numerical value of "7", the 7 output of decoder 4 is provided with the control signal. Each decoder output is adapted to operate, or close, a respective switch included in both the first and second set of switches. Thus, the 0 output of decoder 4 is adapted to operate switches $S_{4a}$ and $S_{4c}$. The 1 output of the decoder is adapted to operate switch $S_{4b}$ and switch $S_{0a}$. In similar fashion, switches $S_{5a}$ and $S_{3b}$ are operated under the control of decoder output 2; switches $S_{5a}$ and $S_{2a}$ are operated under the control of decoder output 3; switches $S_{6a}$ and $S_{2b}$ are operated under the control of decoder output 4; switches $S_{6b}$ and $S_{1a}$ are operated under the control of decoder output 5; switches $S_{7a}$ and $S_{1b}$ are operated under the control of decoder output 6; and switches $S_{7b}$ and $S_{0a}$ are operated under the control of decoder output 7. It will be appreciated, therefore, that decoder 4 operates in response to the digital signal of, for example, [$B_2 B_1 B_0$] to close a predetermined switch in both the first and second sets of switches, and thereby couple to subtracting circuit 3 the divided voltage potentials which are produced at corresponding junctions, or taps, disposed on either side of the aforementioned reference junction.

In FIG. 4, it will be seen that, when the numerical value of the decoded digital signal is an even number, such as "0", "2", "4" and "6", the switches which are closed in the first and second sets of switching circuits are connected to respective taps which are disposed equidistantly from the reference junction. That is, the respective taps are separated from the reference junction by an equal number of resistors. However, when the numerical value of the decoded digital signal is an odd number, the tap which is coupled by the operated switch in, for example, the first set of switches (that is, the tap which is selected by the operation of switches $S_{3a}$, $S_{2a}$, $S_{1a}$ or $S_{0a}$) is separated from the reference junction by a number of resistors which is greater by one resistor than the number of resistors which separates the tap selected by the operated switch in the second set of switching circuits (that is, the tap selected by the operation of switch $S_{4b}$, $S_{5b}$, $S_{6b}$ or $S_{7b}$) from the reference juncction. This is verified by referring particularly to FIG. 4. In general, although not shown in the illustrated embodiment, when the numerical value of the decoded digital signal is an odd number, then the tap which is selected by the operation of a switch in the first set of switches may be separated from the reference junction by no more than a predetermined number of resistors than the separation therefrom of the tap which is selected by the operation of the switch included in the second set of switching circuits. In the preferred embodiment, this predetermined number is equal to one.

In order to compare the improved results attained by the present invention with the results which are attained by the circuit illustrated in FIG. 1, let it be assumed that the decoded digital signal is represented as [100]. As a result of this decoded digital signal, a switch control signal is produced at the 4 output of decoder 4, thereby operating, or closing, switch $S_{2b}$ in the first set of switches and, concurrently, switch $S_{6a}$ in the second set of switches. Although these switches are operated concurrently, it will be appreciated that, if desired, they may be operated in time sequence. As a result of the operation of switch $S_{6a}$, one input of subtracting circuit 3 is supplied with the divided voltage potential 6/8 V. As a result of the operation of switch $S_{2b}$, the other input of subtracting circuit 3 is supplied with the voltage potential 2/8 V. The subtracting circuit subtracts the voltage potential supplied thereto by the first set of switches from the voltage potential supplied thereto by the second set of switches, resulting in the output voltage $V_{out} = 6/8$ V $- 2/8$ V $= \frac{1}{2}$ V. For the remaining digital signals that may be decoded by decoder 4, the first and second sets of switches supply the following voltage potentials to subtracting circuit 3, thereby resulting in the following output voltages $V_{out}$:

[000] $V_{out} = 4/8$ V $- 4/8$ V $= 0$ V

[001] $V_{out} = 4/8$ V $- \frac{3}{8}$ V $= \frac{1}{8}$ V

[010] $V_{out} = \frac{5}{8}$ V $- \frac{3}{8}$ V $= \frac{1}{4}$ V

[011] $V_{out} = \frac{5}{8}$ V $- 2/8$ V $= \frac{3}{8}$ V

[100] $V_{out} = 6/8$ V $- 2/8$ V $= \frac{1}{2}$ V

[101] $V_{out} 6/8$ V $- \frac{1}{8}$ V $= \frac{5}{8}$ V

[110] $V_{out} = \frac{7}{8}$ V $- \frac{1}{8}$ V $= \frac{3}{4}$ V

[111] $V_{out} = \frac{7}{8}$ V $- 0/8$ V $= \frac{7}{8}$ V

From FIG. 3, it is recalled that the actual resistance value of each of resistors 11 and 12 may be expressed as $R + 2\Delta r$, the resistance value of each of resistors 13 and 14 may be expressed as $R + \Delta r$, the resistance value of each of resistors 15 and 16 may be expressed as $R - \Delta r$ and the resistance value of each of resistors 17 and 18 may be expressed as $R - 2\Delta r$; where $\Delta r$ is the resistance error in the integrated circuit fabrication of the D/A converter. In response to the digital signal [100], switch $S_{6a}$, included in the second set of switches, couples the divided voltage potential produced at the tap formed between resistors 16 and 17, and this divided voltage may be expressed as:

$$V_{S6a} = \frac{(R - \Delta r) + (R - \Delta r) + (R + \Delta r) + (R + \Delta r) + (R + 2\Delta r) + (R + 2\Delta r)}{8R} V$$

$$V_{S6a} = \frac{6R + 4\Delta r}{8R} V$$

Also, in response to the decoded digital signal [100], switch $2_{2b}$ is operated to couple, to the other input of subtracting circuit 3, the divided voltage potential produced at the tap between resistors 12 and 13, and this divided voltage may be expressed as:

$$V_{S2b} = \frac{(R + 2\Delta r) + (R + 2\Delta r)}{8R} V$$

$$V_{S2b} = \frac{2R + 4\Delta r}{8R} V$$

Subtracting circuit 3 thus produces the output voltage which may be expressed as:

$$V_{out} = V_{S6a} - V_{S2b} = \left( \frac{6R + 4\Delta r}{8R} - \frac{2R + 4\Delta r}{8R} \right) V = \frac{1}{2} V$$

It is seen that the resistance errors included in the voltage potential applied to subtracting circuit 3 by the first set of switching circuits is equal and opposite to and, thus, cancels the resistance error which is supplied to the other input of the subtracting circuit by the second set of switching circuits. Thus, assuming that the resistance errors included in the string of resistors is progressively increasing or decreasing from one end to the other, the use of the first and second set of switching tree networks together with subtracting circuit 3 tends to cancel such resistance errors virtually without regard to the magnitude thereof.

The foregoing explanation has taken into account resistance errors in the left-to-right direction, as viewed in FIG. 3. A similar cancellation obtains for resistance errors $\Delta r'0$ which may be present between the upper and lower rows of resistors illustrated in FIG. 3. That is, if it is assumed that the resistance value of each of resistors 12, 13, 15 and 18, as viewed in FIG. 3, is represented as $(R + \Delta r')$, which assumption is appropriate inasmuch as the present invention, as thus far is described, cancels resistance errors $\Delta r$, and if it is assumed that the resistance of each of resistors 11, 14, 16 and 17 is represented as $(R - \Delta r')$, then, for the decoded digital signal [100], the output voltage produced by subtracting circuit 3 may be expressed as:

$$V_{out} = \left[ \frac{(R - \Delta r') + (R + \Delta r') + (R - \Delta r') + (R + \Delta r') + (R - \Delta r') + (R + \Delta r')}{8R} V \right] - \left[ \frac{(R + \Delta r') + (R - \Delta r')}{8R} V \right]$$

$$V_{out} = \frac{3}{4} V - \frac{1}{4} V = \frac{1}{2} V$$

Thus, by the arrangement shown in FIGS. 3 and 4, resistance errors $\Delta r'$ likewise are cancelled.

In the interest of brevitiy, further examples of the operation of the D/A converter shown in FIG. 4 are not provided. However, it will be appreciated that, since the output voltage $V_{out}$ is produced by subtracting the voltage potential derived at the tap which is disposed on one side of the reference junction from the voltage potential which is derived at an equal but opposite tap disposed at the other side of the reference junction, errors due to resistance errors $\Delta r$ and $\Delta r'$ are substantially cancelled. Hence, there is no need to manufacture the resistors within very constrained tolerances, such as tolerances on the order of $\pm 8.3\%$ for a 3-bit converter, or tolerances on the order of $\pm 0.4\%$ for an 8-bit converter.

In the example described hereinabove, the numerical value of the digital signal [100] which is converted by the illustrated apparatus is an even number. It will be appreciated that, if the numerical value of the digital signal is an odd number, then the particular tap which is coupled to the output of the first set of switches will not be spaced from the reference junction by the same number of resistors as is the tap which is coupled to the output of the second set of switches. Nevertheless, the respectively coupled taps will be differently separated from the reference junction by only one resistor. For example, if the digital signal [011] having an odd numerical value is to be converted, it is appreciated that decoder 4 responds to this digital signal to operate switches $S_{2a}$ and $S_{5b}$, respectively. The operation of switch $S_{2a}$ couples the tap between resistors 12 and 13 to the output of the first set of switches; and the operation of switch $S_{5b}$ couples the tap between resistors 15 and 16 to the output of the second set of switches. It is appreciated, therefore, that the tap coupled by the operation of switch $S_{2a}$ is separated from the reference junction by two resistors, resistors 13 and 14, whereas the tap coupled by the operation of switch $S_{5b}$ is separated from the reference junction by one resistor, resistor 15. Although the respectively coupled taps are not equally spaced from the reference junction, thus not completely cancelling the effects due to resistance errors, this still has minimal affect upon the accuracy of the converted analog output signal. From FIGS. 3 and 4, it is appreciated that the voltage potential which is coupled to one input of subtracting circuit 3 by the operation of switch $S_{5b}$ may be expressed as:

$$V_{S5b} = \frac{(R - \Delta r + \Delta r') + (R + \Delta r - \Delta r') + (R + \Delta r + \Delta r') + (R + 2\Delta r + \Delta r') + (R + 2\Delta r - \Delta r')}{8R} V$$

$$V_{S5b} = \frac{5R + 5\Delta r + \Delta r'}{8R} V$$

and the voltage potential supplied to the other input of subtracting circuit 3 by the operation of switch $S_{2a}$ may be expressed as:

$$V_{S2a} = \frac{(R + 2\Delta r + \Delta r') + (R + 2\Delta r - \Delta r')}{8R} V$$

-continued $$V_{S2a} = \frac{2R + 4\Delta r}{8R} V$$

and the output voltage produced at output terminal 2 may be expressed as:

$$V_{out} = V_{S5b} - V_{S2a} = \frac{3R + \Delta r + \Delta r'}{8R} V$$

It will be appreciated that the overall resistance error $(\Delta r + \Delta r')/8R$ has relatively little effect upon the converted analog output voltage and, consequently, the resistors which constitute the string of resistors 11 ... 18 need not be formed with the high precision and low tolerances that had been needed for the embodiment shown in FIG. 1.

In the aforedescribed embodiment illustrated in FIG. 4, it has been assumed that each resistor exhibits the resistance value R, including some permissible resistance error. In an alternative embodiment, if each resistor exhibits the resistance value R/2, then the tap which is formed between adjacent resistors having these resistance values may be coupled to only a single switch. That is, in place of the parallel-connected switches which are coupled to each tap illustrated in FIG. 4, each tap will be coupled to the output of a respective set of switches through only one switch. Then, in response to each decoded digital signal, a switch included in the first set as well as a switch included in the second set of switches both will be operated; and such switches will couple taps that are equidistant from the reference junction to the respective outputs of the first and second switches. For example, when the digital signal [001], having the numerical value "1", is converted, a switch included in the first set will operate to couple the tap which is separated from the reference junction by a single resistor (having the resistance R/2) to the output of the first set of switches; and a switch included in the second set is operated to couple the tap which also is separated from the reference junction by a single resistor (having the resistance value R/2) to the output of the second set. When the digital signal [010], having the numerical value "2", is converted, respective taps which are separated from the reference junction by two resistors will be coupled to the outputs of the respective sets of switches. Similarly, when the digital signal [011], having the numerical value "3", is converted, the taps which are coupled to subtracting circuit 3 are separated from the reference junction each by three resistors. Hence, equally-distant taps will be coupled to the subtracting circuit, thereby cancelling resistance errors which may be present in the string of resistors 11 ... 18.

Figure 5:
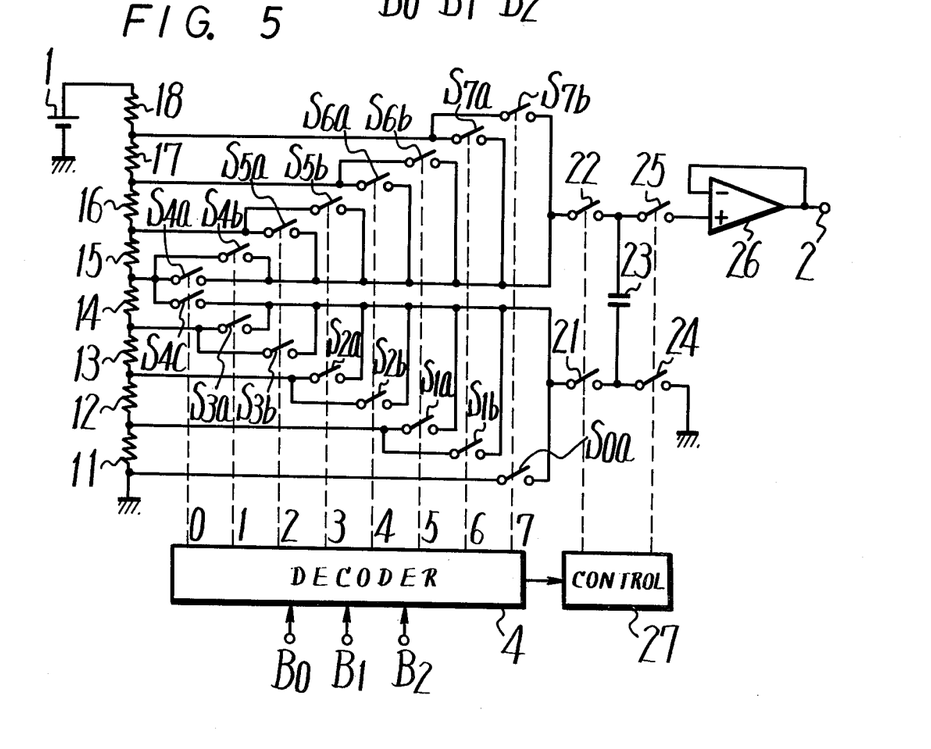
FIG. 5 is a schematic diagram of a more detailed embodiment of the present invention.

Referring now to FIG. 5, there is illustrated another embodiment of the present invention wherein subtracting circuit 3 is shown in greater detail. It will be appreciated that the string of resistors 11 ... 18, decoder 4 and the respective sets of switching circuits which constitute the switching tree network are substantially the same as in FIG. 4. It is seen that the subtracting circuit is comprised of a capacitor 23 whose opposite terminals are coupled, via switches 21 and 22, to the outputs of the first and second sets of switches, respectively. The opposite terminals of capacitor 23 also are coupled to ground via a switch 24 and to a buffer amplifier 26 via another switch 25, respectively. A switch control circuit 27 is connected to control the operation of switches 21, 22, 24 and 25. In particular, and as represented by the broken lines, switch control circuit 27 functions to control switches 21 and 22 substantially simultaneously, and also functions to control switches 24 and 25, also substantially simultaneously. In particular, switch control circuit 27 is supplied with timing pulses (not shown) in sychronism with the timing pulses that are used to supply the digital signal [$B_2B_1B_0$] to decoder 4. The switch control circuit responds to such timing pulses so as to operate, or close, switches 21 and 22 in a timing period immediately following the application of the digital signal to decoder 4, and then, during the next-following timing period, control circuit 27 opens switches 21 and 22 and closes switches 24 and 25.

In operation, after decoder 4 is supplied with a digital signal, switch control circuit 27 closes switches 21 and 22 such that capacitor 23 is charged to a voltage equal to the difference between the voltage potential that is coupled to the opposite terminals thereof by the first and second set of switches, respectively. Thus, the voltage across capacitor 23 represents the converted analog output voltage. For the example wherein the digital signal [100] is supplied to the decoder, switch 22 supplies the voltage potential 6/8 V to one terminal of capacitor 23; and switch 21 supplies the voltage potential 2/8 V to the other terminal of the capacitor, thereby resulting in a voltage across capacitor 23 equal to V/2. After the capacitor is charged to this voltage level, switches 24 and 25 are closed simultaneously. Hence, one terminal of the capacitor is supplied with ground potential abruptly; and since the voltage across a capacitor cannot change instantaneously, the voltage at the other terminal thereof is reduced by the same amount as the voltage reduction which occurred at the first-mentioned capacitor terminal. Consequently, buffer amplifier 26 now is supplied with a voltage potential equal to V/2; and this voltage potential is referenced to ground. The buffer amplifier supplies this analog voltage level to output terminal 2.

Figure 6:
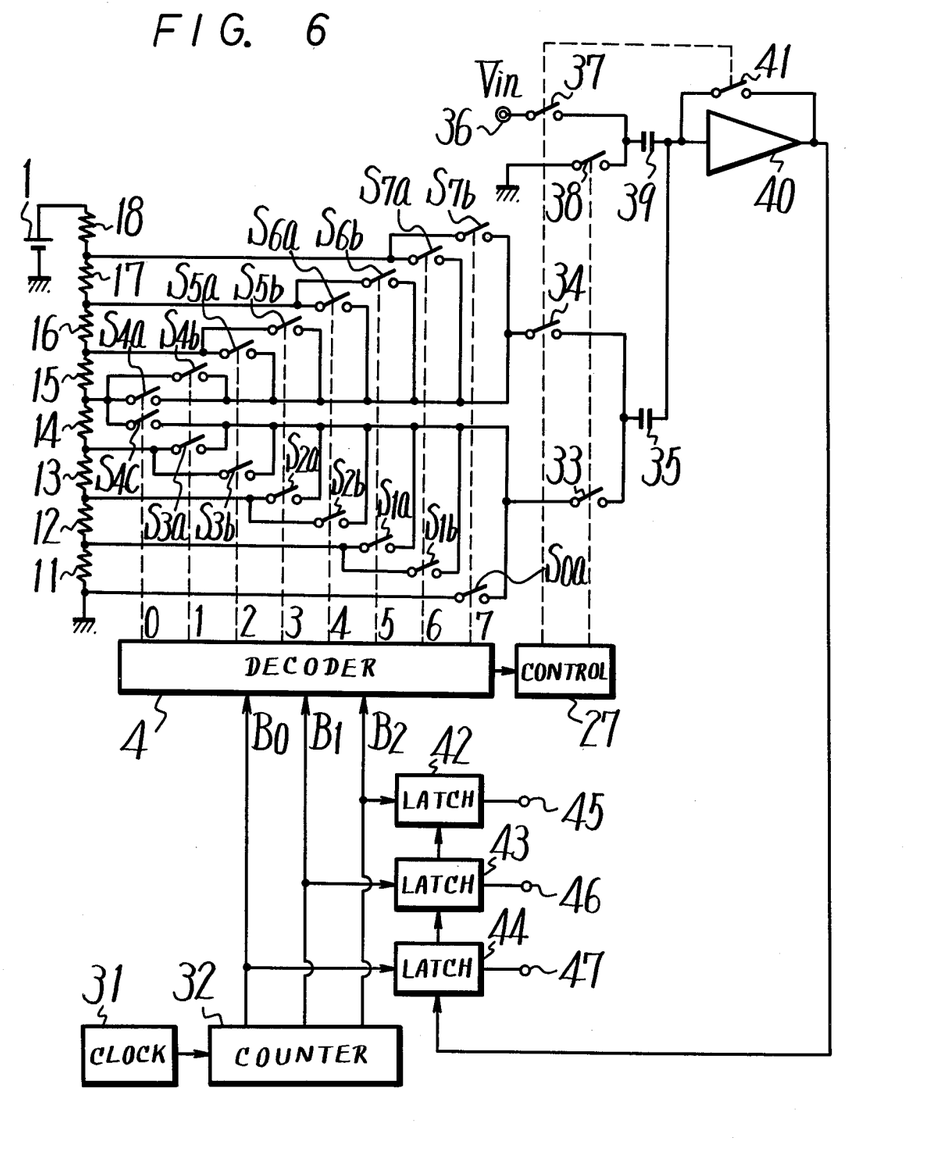
FIG. 6 is a schematic/logic diagram of an analog-to-digital converter incorporating the present invention.

Turning now to FIG. 6, there is illustrated an analog-to-digital converter which incorporates the D/A converter of the present invention as an integral component thereof. The A/D converter is supplied with successive voltage samples of an input signal and, during each sampling interval, successive progressively increasing digital signals are generated, converted to their corresponding analog values and compared to the input sample. When the converted analog signal level is substantially equal to the input sample, the digital signal which resulted in that analog level is "latched" and used to represent the input analog sample.

In FIG. 6, the string of resistors 11 ... 18, the first and second sets of switches, decoder 4 and switch control circuit 27 are substantially the same as described previously with respect to FIG. 5. Here, the outputs of the respective sets of switches are coupled, via switches 33 and 34, to a capacitor 35. Switches 33 and 34 are operated, or closed, alternately by switch control circuit 27. Capacitor 35 is included in the subtracting circuit.

An input terminal 36 is provided to receive successive voltage samples of an input analog signal. Such successive voltage samples are represented as $V_{in}$. These voltage samples are compared to the converted analog voltage level in a comparator comprised of a capacitor 39 and an amplfier 40. A switch 37, under the control of switch control circuit 27 and operable substantially simultaneously with the operation of switch 34, couples the voltage samples supplied to input terminal 36 to one terminal of capacitor 39. This same terminal of capacitor 39 is coupled to ground by a switch 38 which operates substantially simultaneously with the operation of switch 33 under the control of the switch control circuit. The other terminal of capacitor 39 is coupled to the input of amplifier 40; and capacitor 35 also is coupled to this amplifier input. A switch 41, which also is operated simultaneously with switches 34 and 37 under the control of switch control circuit 27 bypasses amplifier 40.

Decoder 4 is supplied, during each sampling interval, with a progressively changing digital signal [$B_2B_1B_0$]. This digital signal is generated by a counter 32 which is driven by a clock generator 31. If the clock generator supplies successive clock pulses to counter 32, the count thereof increments from [000] to [111] in successive steps. This successively incrementing digital signal is decoded by decoder 4 and, in addition, each bit of the digital signal generated by counter 32 is supplied to a respective latch circuit 42, 43 and 44. The latch circuits are coupled to the output of amplifier 40 and are adapted to latch, or store, the digital signals supplied thereto in response to a comparator output signal.

In operation, let it be assumed that a voltage sample $V_{in}$ is supplied to input terminal 36. During the sampling interval that this voltage sample is supplied, clock generator 31 generates successive clock pulses to increment counter 32. In response to each incremented count of the counter, decoder 4 decodes the count to operate a respective switch in each of the first and second sets of switches, as described above. Thus, each digital signal which is generated by counter 32 is converted to a corresponding analog voltage level.

Switch control circuit 27 closes switches 34, 37 and 41 and then switches 33 and 38, alternately, following the decoding of each generated digital signal. When switch 34 is closed, the voltage $V_1$ produced at the output of the first set of switches is supplied to capacitor 35. At the same time, the analog voltage sample $V_{in}$ is supplied, by switch 37, to capacitor 39. Accordingly, the voltage across capacitors 39 and 35 may be expressed as $V_{in}-V_1$. Thereafter, switch control circuit 27 opens switches 34 and 27 and closes switches 33 and 38. Consequently, capacitor 35 now is reduced by the voltage $V_2$ produced at the output of the second set of switches, and the voltage at capacitor 39 is reduced by the amount $V_{in}$. Thus, the voltage across capacitors 39 and 35 now may be expressed as $V_{in}-(V_1-V_2)$. This voltage is supplied to amplifier 40 which senses when the difference between the input analog voltage $V_{in}$ and the analog level ($V_1-V_2$) produced by the D/A converter is substantially equal to zero. At that time, the comparator supplies a comparator output signal to each of latch circuits 42, 43 and 44 to latch, or store, the digital signal then produced by counter 32.

It is appreciated that comparator 40 does not produce the comparator output signal until the digital signal $[B_2B_1B_0]$ has been incremented sufficiently such that its corresponding analog level, as produced by the illustrated D/A converter, is substantially equal to the input analog voltage sample $V_{in}$. At that time, digital output terminals 45, 46 and 47 are supplied with the digital signal $[B_2B_1B_0]$ from latch circuits 42, 43 and 44, respectively, which is a digital representation of the input analog voltage sample $V_{in}$.

In an alternative embodiment, the subtracting circuit illustrated in FIG. 5 may be used, and buffer amplifier 26 may be replaced by a differential amplifier which is adapted to compare the input analog voltage sample $V_{in}$ with the analog output signal $V_{out}$ produced by the D/A converter. When the analog voltage sample compares favorably to the converted analog output signal, the differential amplifier then will supply a suitable latch signal to latch circuits 42, 43 and 44.

While the present invention has been particularly shown and described with reference to certain preferred embodiments, it will be readily appreciated by those of ordinary skill in the art that various changes and modifications in form and details may be made without departing from the spirit and scope of the invention. Some of these modifications and alternative embodiments have been described above. It is seen that the present invention results in a relatively low-cost digital-to-analog converter to be formed of an integrated circuit, and the respective resistors may be constructed on a common integrated circuit pellet without serious concern with maintaining the resistance values thereof within close tolerances.

It is intended that the appended claims be interpreted as including the foregoing as well as other changes and modifications.

What is claimed is:

1. A digital-to-analog (D/A) converter comprising a plurality of series-connected resistor means, adjacent ones of said resistor means defining respective junctions therebetween including a reference junction substantially at the mid-point of said plurality of series-connected resistor means; means for supplying a voltage across said series-connected resistor means; a plurality of switch means arranged as a first set coupled to said junctions at one side of said reference junction and as a second set coupled to said junctions at the other side of said reference junction and selectively operable to couple a potential produced at a respective junction; combining means having one input coupled in common to said first set of said switch means to receive the potential coupled thereto when a switch means included in said first set is operated and having another input coupled in common to said second set of said switch means to receive the potential coupled thereto when a switch means included in said second set is operated for combining one of said coupled potentials with the other to produce an analog output signal representing said two coupled potentials; and switch control means responsive to a multi-bit digital signal for operating predetermined switch means in both said first and second sets and thereby coupled to said combining means said potentials produced at corresponding junctions disposed on either side of said reference junction in accordance with said digital signal.

2. The D/A converter of claim 1 wherein one corresponding junction disposed on one side of said reference junction is separated therefrom by a number of resistor means which differs by no more than a predetermined amount from the number of resistor means which separates the other corresponding junction disposed on the other side of said reference junction from said reference junction.

3. The D/A converter of claim 2 wherein each resistance means exhibits a value that deviates from a desired value R and wherein said predetermined amount is a single resistor means.

4. The D/A converter of claim 3 wherein said one and other corresponding junctions are separated from said reference junction by equal numbers of resistor means when said digital signal is of an even value, and the numbers of resistors by which said one and other corresponding junctions are separated from said reference junction differ by a single resistor means when said digital signal is of an odd value.

5. The D/A converter of claim 4 wherein the deviation of the actual value of each resistor means from said desired value increases as said resistor means are separated further away from said reference junction.

6. The D/A converter of claim 1 wherein said plurality of series-connected resistor means are formed on a common integrated circuit pellet.

7. The D/A converter of claim 6 wherein said series-connected resistor means are arranged in serpentine configuration such that current flows in the same direction through resistor means that are equally spaced from and on either side of said reference junction.

8. The D/A converter of claim 1 wherein said combining means includes capacitor means connected at one terminal to said first set of switch means and at the other terminal to said second set of switch means for storing a difference in respective potentials thereacross, representing said analog output signal.

9. The D/A converter of claim 8 wherein said combining means further includes buffer amplifier means coupled to said one terminal of said capacitor means for supplying said stored difference potential representing said analog output signal to an output terminal.

10. The D/A converter of claim 1 wherein said combining means comprises capacitor means having terminals connected between said inputs of said combining means; first switches for supplying to said capacitor means the potentials coupled by the operated switch means in said first and second sets of switch means; a buffer amplifier; second switches for coupling one capacitor terminal to said buffer amplifier and for coupling the other capacitor terminal to a reference voltage; and a control circuit for operating said first and second switches alternately.

11. The D/A converter of claim 1 wherein said switch control means comprises decoder means for decoding each digital signal to produce a respective switch control signal for operating a predetermined switch means in said first set and a predetermined switch means in said second set as a function of the decoded digital signal.

12. A converter comprising a source of successively changing digital signal; digital-to-analog converter means coupled to said source of digital signal to convert the successively changing digital signal to corresponding analog signal levels, said digital-to-analog converter means comprising a plurality of series-connected resistor means, adjacent ones of said resistor means defining respective junctions therebetween including a reference junction substantially at the mid-point of said series-connected resistor means; means for supplying a voltage across said series-connected resistor means; plural switch means arranged as a first set coupled to said junctions located at one side of said reference junction and as a second set coupled to said junctions located at the other side of said reference junction and each of said sets being selectively operable to couple a potential produced at a respective junction; potential difference means having one input coupled in common to said first set of said switch means to receive the potential coupled thereto when a switch means included in said first set is operated and having another input coupled in common to said second set of said switch means to receive the potential coupled thereto when a switch means included in said second set is operated for storing a potential difference between one of said coupled potentials and the other to produce an analog signal level; switch control means responsive to said digital signal for operating predetermined switch means in both said first and second sets and thereby couple to said potential difference means potentials present at corresponding junctions disposed on either side of said reference junction in accordance with said digital signal; a source of analog signal; comparator means for comparing the analog signal of said last-mentioned source to said produced analog signal level; and selecting means for selecting the digital signal which results in said analog signal level that compares to said analog signal of said last-mentioned source to provide a digital representation of said analog signal.

13. The converter of claim 12 wherein one corresponding junction disposed on one side of said reference junction is separated therefrom by a number of resistor means which differs by no more than a predetermined amount from the number of resistor means which separates the other corresponding junction disposed on the other side of said reference junction from said reference junction.

14. The converter of claim 13 wherein said potential difference means comprises capacitor means; a first switch for supplying to said capacitor means the potential coupled when a switch means included in said first set is operated; a second switch for supplying to said capacitor means the potential coupled when a switch means included in said second set is operated; and a control circuit for operating said first and second switches alternately.

15. The converter of claim 14 wherein said comparator means comprises additional capacitor means; a third switch operable substantially concurrently with said first switch for supplying to said additional capacitor means said analog signal; a fourth switch operable substantially concurrently with said second for supplying to said additional capacitor means a reference voltage; said first-mentioned and additional capacitor means being connected in common to define a connection point separated by said respective capacitor means from said switches; and amplifier means coupled to said connection point to produce a comparison signal when the voltage at said connection point is approximately equal to a predetermined level.

16. The converter of claim 15 wherein said selecting means comprises latch means coupled to said source of digital signal and responsive to said produced comparison signal to latch therein the digital signal then produced by said digital signal source.

* * * * *